(12) United States Patent
Cui (10) Patent No.: US 9,461,630 B1
(45) Date of Patent: Oct. 4, 2016

(54) LOW CURRENT AND HIGH FREQUENCY OSCILLATOR CIRCUIT

(71) Applicant: STMicroelectronics (China) Investment Co. Ltd, Shanghai (CN)

(72) Inventor: Zhenghao Cui, Beijing (CN)

(73) Assignee: STMICROELECTRONICS (CHINA) INVESTMENT CO. LTD, Shanghai (CN)

( * ) Notice: Subject to any disclaimer, the term of this patent is extended or adjusted under 35 U.S.C. 154(b) by 0 days.

(21) Appl. No.: 14/809,928

(22) Filed: Jul. 27, 2015

(30) Foreign Application Priority Data

Jul. 1, 2015 (CN) .......................... 2015 1 0378625

(51) Int. Cl.
*H03K 3/012* (2006.01)
*H03K 3/03* (2006.01)

(52) U.S. Cl.
CPC ............ *H03K 3/012* (2013.01); *H03K 3/0315* (2013.01)

(58) Field of Classification Search
CPC .. H03K 3/012; H03K 3/0315; H03K 3/0322; H03L 7/0995
USPC ..................... 331/45, 57, 185, 186
See application file for complete search history.

(56) References Cited

U.S. PATENT DOCUMENTS

| | | | | | |
|---|---|---|---|---|---|
| 4,146,849 | A * | 3/1979 | Satou | ...................... | H03K 7/06 331/108 D |
| 5,272,453 | A * | 12/1993 | Traynor | ............... | H03K 3/0315 331/108 A |
| 5,304,859 | A * | 4/1994 | Arimoto | ................. | G05F 3/205 327/534 |
| 5,594,391 | A * | 1/1997 | Yoshizawa | ........... | H03K 3/0315 327/264 |
| 5,764,110 | A * | 6/1998 | Ishibashi | ................ | H03K 3/011 331/177 R |
| 5,945,883 | A * | 8/1999 | Nagasawa | .............. | H03K 3/011 331/177 R |
| 6,107,845 | A * | 8/2000 | Lee | ....................... | H03K 3/0315 327/101 |
| 6,127,898 | A * | 10/2000 | Naura | .................. | H03K 3/0231 326/31 |
| 6,803,831 | B2 * | 10/2004 | Nishikido | ............ | H03K 3/0315 331/17 |
| 7,129,796 | B2 * | 10/2006 | Goto | .................... | H03K 3/0315 331/17 |
| 7,936,225 | B2 * | 5/2011 | Osada | .................... | H03K 5/133 331/175 |
| 9,007,138 | B2 * | 4/2015 | Muller | ...................... | H03L 7/06 327/142 |
| 9,229,465 | B2 * | 1/2016 | Dhiman | ................. | H03K 19/00 |

\* cited by examiner

*Primary Examiner* — Levi Gannon
(74) *Attorney, Agent, or Firm* — Gardere Wynne Sewell LLP (57) ABSTRACT

An oscillator circuit operates to selectively charge and discharge a capacitance with a charging circuit. An inverting circuit includes a first transistor, second transistor, third transistor and fourth transistor having source-drain paths coupled in series. The second and third transistors are connected as an inverter with an input coupled to the capacitance and an output. A feedback loop couples the output of the inverter to an input of the charging circuit. A first shunting transistor is configured to selective shunt across the first transistor in response to a first logic state of a feedback signal in the feedback path. A second shunting transistor is configured to selective shunt across the fourth transistor in response to a second logic state of the feedback signal in the feedback path.

20 Claims, 6 Drawing Sheets

LOW CURRENT AND HIGH FREQUENCY OSCILLATOR CIRCUIT

PRIORITY CLAIM

This application claims priority from Chinese Application for Patent No. 201510378625.6 filed Jul. 1, 2015, the disclosure of which is incorporated by reference.

TECHNICAL FIELD

The present invention relates to oscillator circuits and, in particular, to integrated circuit oscillators having low current consumption and high oscillation frequency operating characteristics.

BACKGROUND

An oscillator circuit is a common circuit component in many circuit systems. For example, such an oscillator circuit may be used to generate a clock signal or a mixing signal. It is desirable for the oscillator output signal to have a high operating frequency. However, those skilled in the art understand that as the operating frequency increases so does the current consumption. There is accordingly a need in the art for an integrated circuit oscillator capable of operation at a high output frequency with low current consumption.

SUMMARY

In an embodiment, a circuit comprises: a capacitor coupled between a charge node and a first reference node; a charging circuit operating to alternately charge and discharge the capacitor; a first inverter circuit having an input coupled to the capacitor and having an output, the first inverter circuit comprising a first transistor, second transistor, third transistor and fourth transistor having source-drain paths coupled in series between a first supply node and a second supply node; a feedback loop coupling the output of the first inverter circuit to an input of the charging circuit; a first pull-up transistor operating responsive to a first logic state of a feedback signal in the feedback loop to selectively shunt across the first transistor of the first inverter circuit; and a first pull-down transistor operating responsive to a second logic state of the feedback signal to selectively shunt across the second transistor of the second inverter circuit.

In an embodiment, a circuit comprises: a first transistor having a source-drain path coupled between a first supply node and a charge node; a second transistor having a source-drain path coupled between the charge node and a second supply node; wherein control terminals of the first and second transistors are connected together at an input node; a capacitor coupled between the charge node and a first reference node; a third transistor, fourth transistor, fifth transistor and sixth transistor having source-drain paths coupled in series between the first supply node and the second supply node; wherein control terminals of the fourth and fifth transistors are connected together at the charge node and drain terminals of the fourth and fifth transistors are connected together at an output node; a feedback loop coupling the output node to the input node; a seventh transistor having a source-drain path coupled in parallel with the source-drain path of the third transistor and having a control terminal coupled to the feedback loop; and an eighth transistor having a source-drain path coupled in parallel with the source-drain path of the sixth transistor and having a control terminal coupled to the feedback loop.

In an embodiment, a circuit comprises: a capacitor coupled between a charge node and a first reference node; a charging circuit operating to alternately charge and discharge the capacitor; a first inverter circuit having an input coupled to the capacitor and having an output, the first inverter circuit being selectively configurable to operate with two different threshold switching voltages; and a feedback loop coupling the output of the first inverter circuit to an input of the charging circuit; wherein a first threshold switching voltage is selected for the first inverter circuit in response to a first logic state of a feedback signal in the feedback loop; and wherein a second threshold switching voltage, different from the first threshold switching voltage, is selected for the first inverter circuit in response to a second logic state of the feedback signal in the feedback loop.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
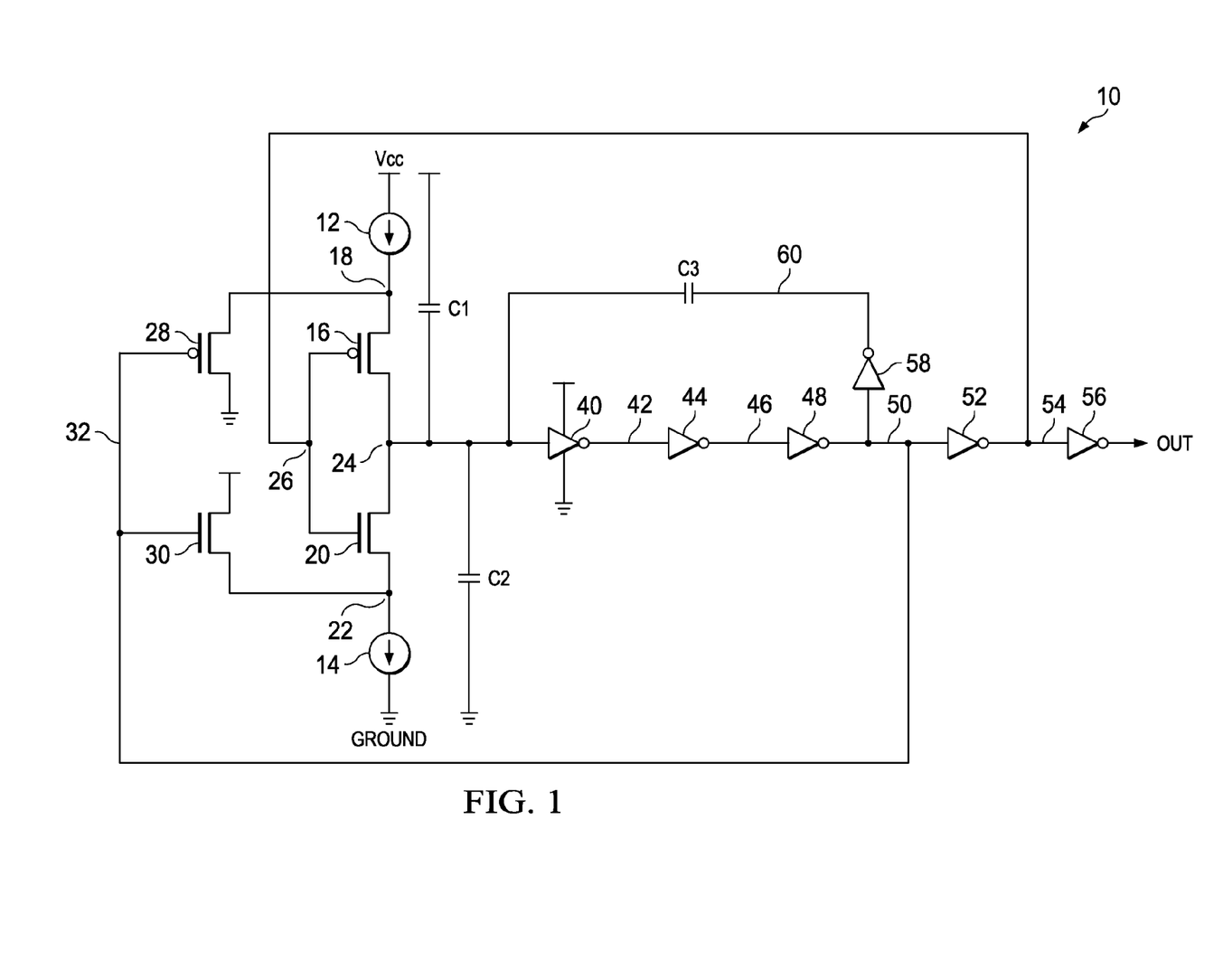
FIG. 1 is a circuit diagram of an integrated circuit oscillator of the ring-oscillator type.

Reference is now made to FIG. 1 which illustrates a schematic circuit diagram of an integrated circuit oscillator 10 of the ring-oscillator type. The oscillator 10 includes a current source 12 coupled to a first supply node (Vcc) and a current sink 14 coupled to a second supply node (Ground). A first transistor 16, in this case a MOSFET p-channel device, has its source terminal coupled at node 18 to receive current sourced from the current source 12. A second transistor 20, in this case a MOSFET n-channel device, has its source terminal coupled at node 22 to output current sunk by the current sink 14. The drain terminals of the transistors 16 and 18 are coupled together at node 24. The gate terminals of the transistors 16 and 18 are coupled together at node 26 to receive a feedback signal. The source 12, sink 14 and transistors 16 and 20 form a charging circuit.

A pull-down transistor 28, in this case a MOSFET p-channel device, has its source terminal coupled to node 18 and its drain terminal coupled to the ground supply node. A pull-up transistor 30, in this case a MOSFET n-channel device, has its source terminal coupled to node 22 and its drain terminal coupled to the Vcc supply node. The gate terminals of the transistors 28 and 30 are coupled together at node 32.

A first capacitor C1 is coupled between node 24 and the Vcc supply node. A second capacitor C2 is coupled between node 24 and the ground supply node.

A first CMOS inverter circuit 40 has its input coupled to node 24 and its output coupled to node 42. A second CMOS inverter circuit 44 has its input coupled to node 42 and its output coupled to node 46. A third CMOS inverter circuit 48 has its input coupled to node 46 and its output coupled to node 50. A fourth CMOS inverter circuit 52 has its input coupled to node 50 and its output coupled to node 54. A fifth CMOS inverter circuit 56 has its input coupled to node 54 and its output coupled to output node OUT.

A sixth CMOS inverter circuit 58 is coupled in series at node 60 with a third capacitor C3, with that series circuit connected between node 50 and node 24. Those skilled in the art will note that the logic state at the output of inverter 52 is the same as at node 60. Thus, inverter 58 may be omitted in an implementation, with node 60 coupled to the output of inverter 52 so long as sufficient drive current is output from inverter 52 to charge capacitor C3 and ensure fast transient voltage change at the input of inverter 56. In a preferred implementation, however, it is better to provide a separate inverter 58, as shown, to provide the necessary drive current for capacitor C3, while inverter 52 operates with a fast voltage transient to drive the input of inverter 56 and the inverting circuit formed by transistors 16 and 20. This configuration results in improved circuit performance. Indeed, it is best for the transient voltage at node 54 to be faster than the transient voltage at node 60.

Node 54 is short circuit connected to node 26 in a feedback loop to supply the feedback signal for the ring oscillation. Node 50 is short circuit connected to node 32 to control operation of the pull-up and pull-down transistors in order to ensure a smooth change between the charge/discharge as will be described herein.

Each CMOS inverter circuit (40, 44, 48, 52, 56 and 58) comprises a p-channel MOSFET and n-channel MOSFET whose source-drain paths are coupled in series between the Vcc supply node and the ground supply node. The gate terminals of the transistors in the CMOS inverter circuit are coupled together at the inverter circuit input and the drain terminals of the transistors are coupled together at the inverter circuit output.

The circuit 10 of FIG. 1 is capable of operating with an output frequency as high as, for example, tens of megahertz. The principle of circuit 10 operation is to charge and discharge the capacitively coupled node 24 with the source current from source 12 and the sink current from sink 14, respectively. The voltage at node 60 on the opposite side of capacitor C3 changes quickly between the Vcc voltage and the ground voltage.

Assume at start-up that nodes 24 and 60 are at the ground voltage. Node 54 will also be at the ground voltage, and this will cause transistor 16 to turn on and pass source current from source 12 so as to charge capacitor C2, with the voltage on capacitor C2 rising towards the threshold switching voltage of the inverter circuit 40. This threshold switching voltage may, for example, be about Vcc/2. When the voltage stored on capacitor C2 exceeds the threshold switching voltage of the inverter circuit 40, the inverter 40 switches state and node 42 is forced to the ground voltage. The states of inventors 44, 48, 52 and 58 then cause nodes 54 and 60 to quickly switch to the Vcc voltage (with node 50 switching to the ground voltage to turn transistor 28 on and transistor 30 off in order to ensure a smooth change between the charge/discharge). The voltage stored on capacitor C2 at node 24 will then abruptly rise from Vcc/2 to the Vcc voltage. The Vcc voltage at node 54 (and thus also at node 26) turns off transistor 16 and turns on transistor 20. Sink current from sink 14 discharges capacitor C2 (and charges capacitor C1) causing the voltage at node 24 to fall towards the threshold switching voltage of the inverter circuit 40. This threshold switching voltage may, for example, be about Vcc/2. When the voltage stored on capacitor C2 falls below the threshold switching voltage of the inverter circuit 40, the inverter 40 switches state and node 42 is forced to the Vcc voltage. The states of inventors 44, 48, 52 and 58 then cause nodes 54 and 60 to quickly switch to the ground voltage (with node 50 switching to the Vcc voltage to turn transistor 28 off and transistor 30 on in order to ensure a smooth change between the charge/discharge). The voltage stored on capacitor C2 at node 24 will then abruptly fall from Vcc/2 to the ground voltage. The ground voltage at node 54 (and thus also at node 26) turns on transistor 16 and turns off transistor 20, and the cycle of operation as described above repeats. The output signal at output node OUT is an oscillating square wave whose frequency is set as a function of the capacitances of capacitors C1, C2 and C3 and the current strength of source 12 and sink 14.

Figure 2:
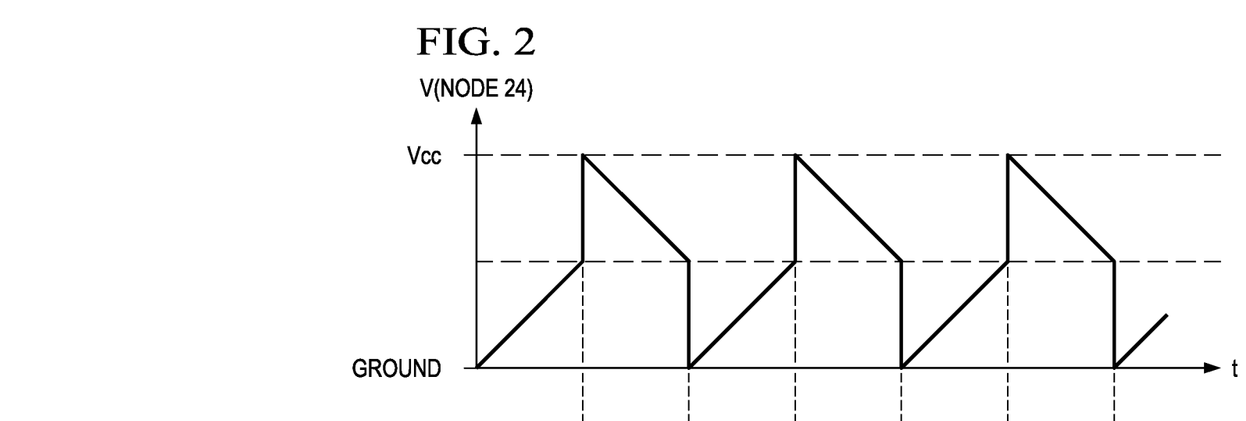
FIG. 2 is a waveform diagram showing change in capacitor voltage over time for the circuit of FIG. 1.
Figure 3:
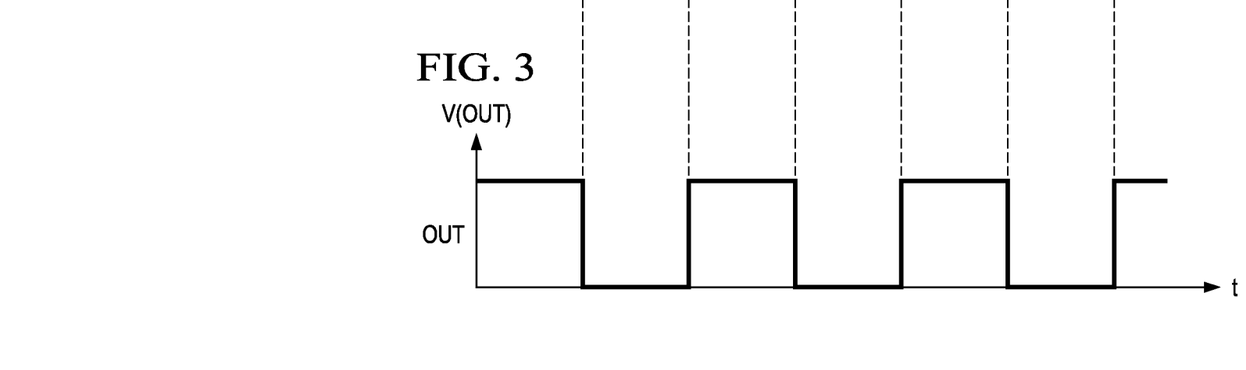
FIG. 3 is a waveform diagram showing the output signal for the circuit of FIG. 1.

A disadvantage of the circuit 10 architecture is that the change in voltage at node 24 uses a relatively strong overdrive through operation of inverter 40 as shown in FIG. 2 with a corresponding large current consumption. The output signal OUT is shown in FIG. 3.

Figure 4:
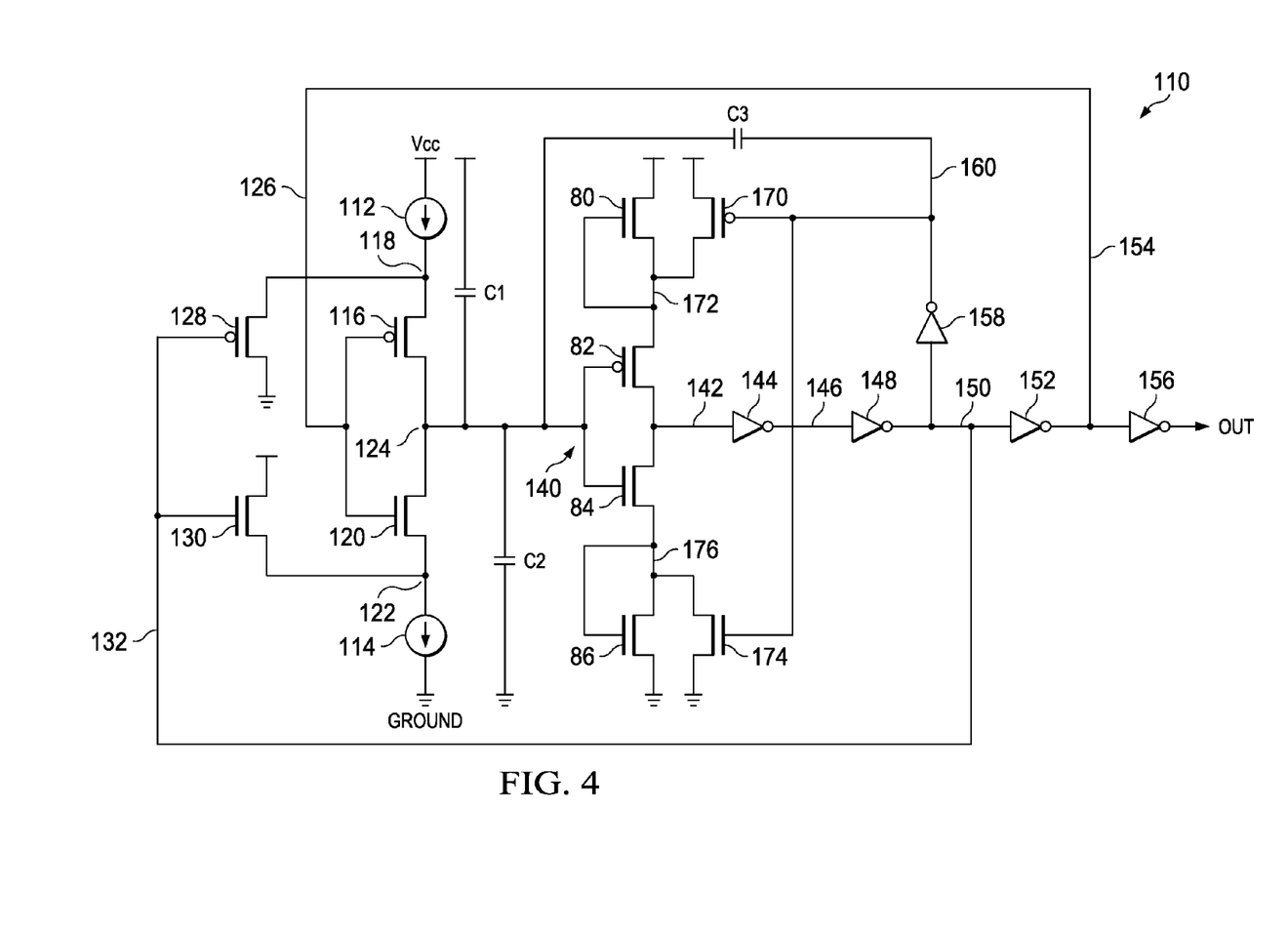
FIG. 4 is a circuit diagram of an integrated circuit oscillator of the ring-oscillator type.

Reference is now made to FIG. 4 which illustrates a schematic circuit diagram of an integrated circuit oscillator 110 of the ring-oscillator type. The oscillator 110 includes a current source 112 coupled to a first supply node (Vcc) and a current sink 114 coupled to a second supply node (Gnd). A first transistor 116, in this case a MOSFET p-channel device, has its source terminal coupled at node 118 to receive current sourced from the current source 112. A second transistor 120, in this case a MOSFET n-channel device, has its source terminal coupled at node 122 to output current sunk by the current sink 114. The drain terminals of the transistors 116 and 118 are coupled together at node 124. The gate terminals of the transistors 116 and 118 are coupled together at node 126 to receive a feedback signal. The source 112, sink 114 and transistors 116 and 120 form a charging circuit.

A first pull-down transistor 128, in this case a MOSFET p-channel device, has its source terminal coupled to node 118 and its drain terminal coupled to the ground supply node. A first pull-up transistor 130, in this case a MOSFET n-channel device, has its source terminal coupled to node 122 and its drain terminal coupled to the Vcc supply node. The gate terminals of the transistors 128 and 130 are coupled together at node 132.

A first capacitor C1 is coupled between node 124 and the Vcc supply node. A second capacitor C2 is coupled between node 124 and the ground supply node.

A first CMOS inverter circuit 140 is formed by series connecting the source-drain paths of a first diode-connected transistor 80, in this case a MOSFET p-channel device with its gate terminal connected to its drain terminal, a p-channel MOSFET transistor 82, an n-channel MOSFET transistor 84 and a second diode-connected transistor 86, in this case a MOSFET n-channel device with its gate terminal connected to its drain terminal. The drain terminals of the MOSFET transistors 82 and 84 are coupled together at node 142. The gate terminals of the MOSFET transistors 82 and 84 are coupled together at node 124.

A second CMOS inverter circuit 144 has its input coupled to node 142 and its output coupled to node 146. A third CMOS inverter circuit 148 has its input coupled to node 146 and its output coupled to node 150. A fourth CMOS inverter circuit 152 has its input coupled to node 150 and its output coupled to node 154. A fifth CMOS inverter circuit 156 has its input coupled to node 154 and its output coupled to output node OUT.

A sixth CMOS inverter circuit 158 is coupled in series at node 160 with a third capacitor C3, with the series circuit connected between node 150 and node 124.

A second pull-up transistor 170, in this case a MOSFET p-channel device, has its source terminal coupled to the VCC supply node and its drain terminal coupled to node 172 (at the location where the drain terminal of first diode-connected transistor 80 is coupled to the source terminal of p-channel MOSFET transistor 82). When actuated, transistor 170 shunts across the transistor 80, essentially connecting node 172 to the VCC supply node. A second pull-down transistor 174, in this case a MOSFET n-channel device, has its source terminal coupled to the ground supply node and its drain terminal coupled to node 176 (at the location where the drain terminal of second diode-connected transistor 86 is coupled to the source terminal of n-channel MOSFET transistor 86). When actuated, transistor 174 shunts across the transistor 86, essentially connecting node 176 to the ground supply node. The gate terminals of second pull-up transistor 170 and second pull-down transistor 174 are coupled together at node 160.

This configuration for inverter circuit 140 accordingly permits operation with a selectively configurable threshold switching voltage. The threshold switching voltage has a first voltage level (for example, 2Vcc/3) when transistor 170 is actuated to shunt across transistor 80, and has a second voltage level (for example, Vcc/3) when transistor 174 is actuated to shunt across transistor 86.

Node 154 is short circuit connected to node 126 in the feedback loop to supply the feedback signal for ring oscillation. Node 150 is short circuit connected to node 132 to control operation of the pull-up and pull-down transistors 128 and 130 in order to ensure a smooth change between the charge/discharge as will be described herein.

Each CMOS inverter circuit (144, 148, 152, 156 and 158) comprises a p-channel MOSFET and n-channel MOSFET whose source-drain paths are coupled in series between the Vcc supply node and the ground supply node. The gate terminals of the transistors in the CMOS inverter circuit are coupled together at the inverter input and the drain terminals of the transistors are coupled together at the inverter output.

The circuit 110 of FIG. 4 is capable of operating with an output frequency as high as, for example, tens of megahertz. The principle of circuit 110 operation is to charge and discharge the capacitively coupled node 124 with the source current from source 112 and the sink current from sink 114, respectively. The voltage at node 160 on the opposite side of capacitor C3 changes quickly between the Vcc voltage and the ground voltage. This voltage at node 160 is further used to decrease current consumption by the first CMOS inverter circuit 140 (for example, in comparison to inverter 40 of the circuit 10 of FIG. 1), and thus reduce the overall current consumption of the circuit 110.

Assume at start-up that nodes 124 and 160 are at the ground voltage. The ground voltage at node 160 causes transistor 170 to be turned on (shunting across the diode-connected transistor 80) and causes transistor 174 to be turned off (thus leaving diode-connected transistor 86 in the inverter circuit). Node 154 will also be at the ground voltage, and this will cause transistor 116 to turn on and pass source current from source 112 so as to charge capacitor C2, with the voltage on capacitor C2 rising towards the higher threshold switching voltage of the inverter circuit 140. This higher threshold switching voltage may, for example, be about 2Vcc/3 due to the operation of transistors 170 and 174 and the selective presence of only diode-connected transistor 86 (because transistor 80 is shunted by actuation of transistor 170). When the voltage stored on capacitor C2 exceeds the higher threshold switching voltage of the inverter circuit 140, the inverter 140 switches state and node 142 is forced to the ground voltage. The states of inventors 144, 148, 152 and 158 then cause nodes 154 and 160 to quickly switch to the Vcc voltage (with node 150 switching to the ground voltage to turn transistor 128 on and transistor 130 off in order to ensure a smooth change between the charge/discharge). The voltage stored on capacitor C2 at node 124 will then abruptly rise from 2Vcc/3 to the Vcc voltage. The Vcc voltage at node 160 causes transistor 174 to be turned on (shunting across the diode-connected transistor 86) and causes transistor 170 to be turned off (thus leaving diode-connected transistor 80 in the inverter circuit). The Vcc voltage at node 154 (and thus also at node 126) turns off transistor 116 and turns on transistor 120. Sink current from sink 114 discharges capacitor C2 causing the voltage at node 124 to fall towards the lower threshold switching voltage of the inverter circuit 140. This lower threshold switching voltage may, for example, be about Vcc/3 due to the operation of transistors 170 and 174 and the selective presence of only diode-connected transistor 80 (because transistor 86 is shunted by actuation of transistor 174). When the voltage stored on capacitor C2 falls below the lower threshold switching voltage of the inverter circuit 140, the inverter 140 switches state and node 142 is forced to the Vcc voltage. The states of inventors 144, 148, 152 and 158 then cause nodes 154 and 160 to quickly switch to the ground voltage (with node 150 switching to the Vcc voltage to turn transistor 128 off and transistor 130 on in order to ensure a smooth change between the charge/discharge). The voltage stored on capacitor C2 at node 124 will continue to fall towards the ground voltage. The ground voltage at node 154 (and thus also at node 126) turns on transistor 116 and turns off transistor 120, and the cycle of operation as described above repeats. The output signal at output node OUT is an oscillating square wave whose frequency is set as a function of the capacitances of capacitors C1, C2 and C3 and the current strength of source 112 and sink 114.

Figure 5:
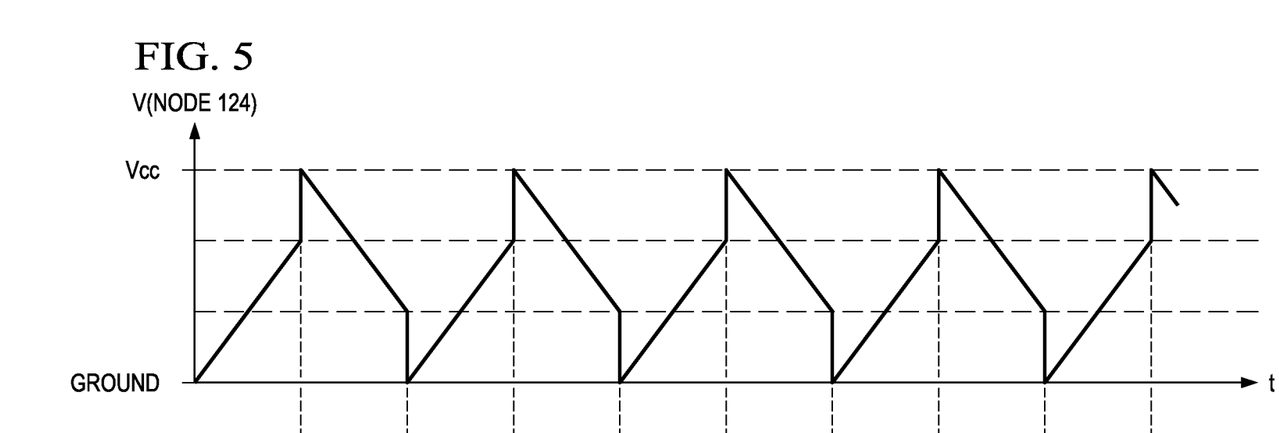
FIG. 5 is a waveform diagram showing change in capacitor voltage over time for the circuit of FIG. 4.
Figure 6:
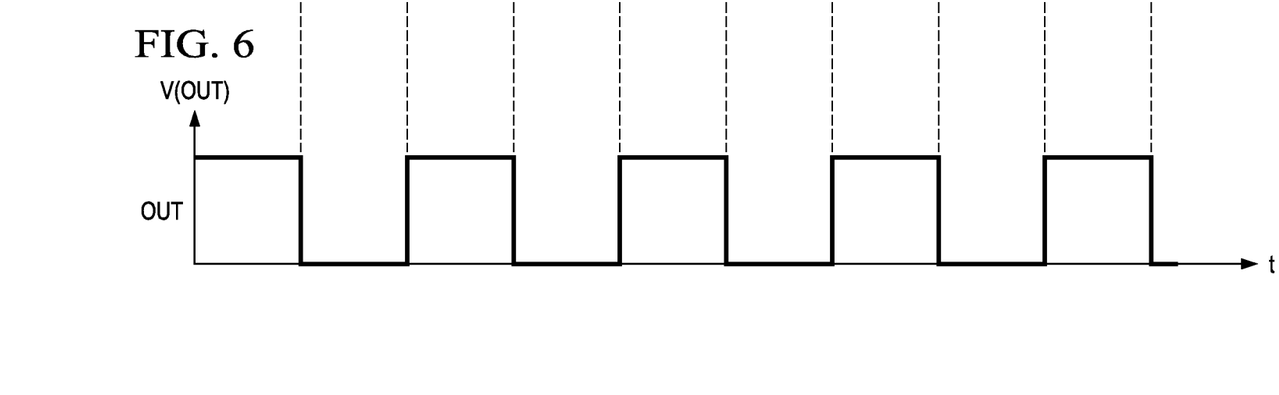
FIG. 6 is a waveform diagram showing the output signal for the circuit of FIG. 4.

An advantage of the circuit 110 architecture is that the change in voltage at node 124 uses a reduced overdrive through operation of inverter 140 as shown in FIG. 5. The output signal OUT is shown in FIG. 6.

Figure 7:
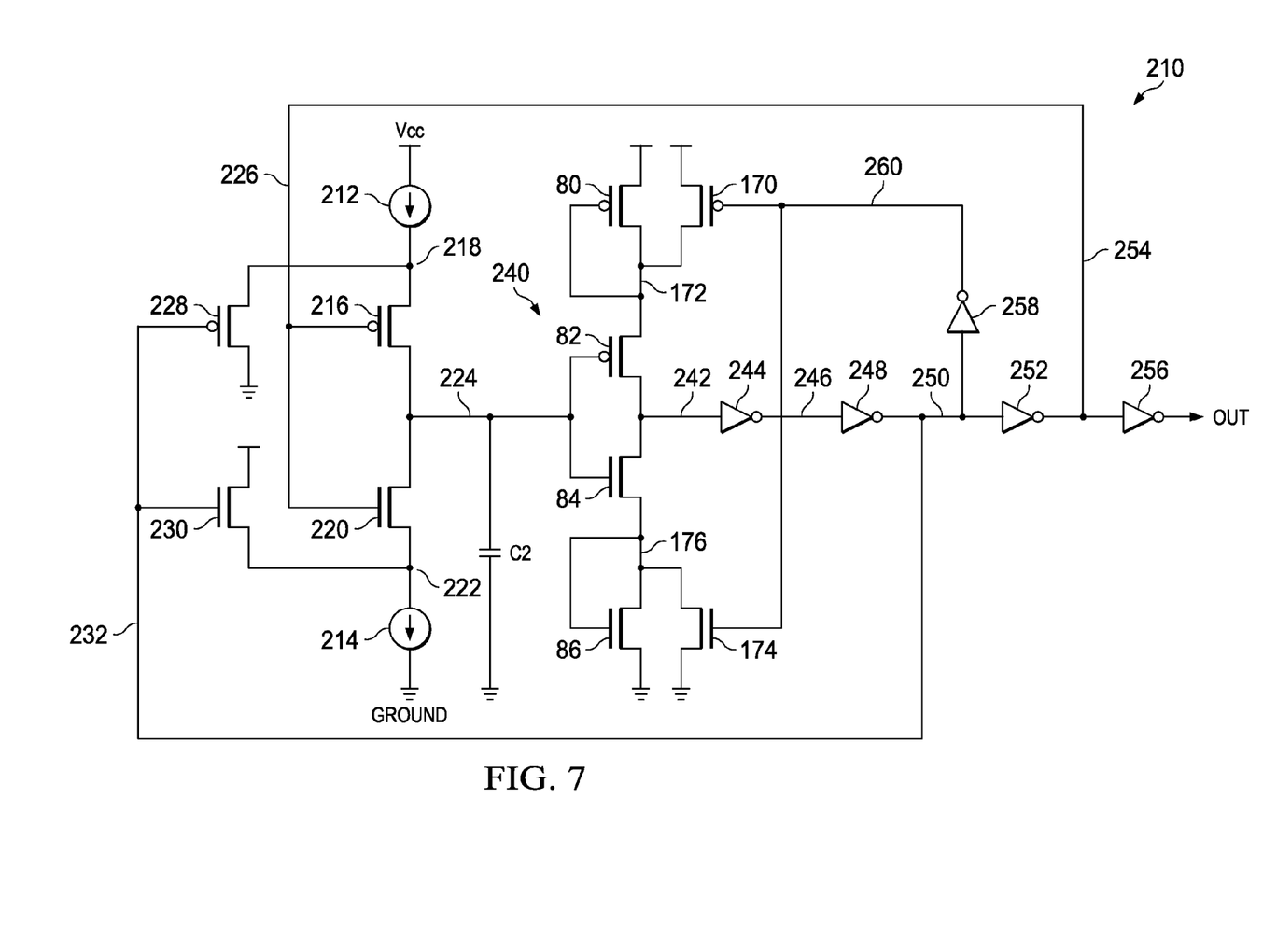
FIG. 7 is a circuit diagram of an integrated circuit oscillator of the ring-oscillator type.

Reference is now made to FIG. 7 which illustrates a schematic circuit diagram of an integrated circuit oscillator 210 of the ring-oscillator type. The oscillator 210 includes a current source 212 coupled to a first supply node (Vcc) and a current sink 214 coupled to a second supply node (Gnd). A first transistor 216, in this case a MOSFET p-channel device, has its source terminal coupled at node 218 to receive current sourced from the current source 212. A second transistor 220, in this case a MOSFET n-channel device, has its source terminal coupled at node 222 to output current sunk by the current sink 214. The drain terminals of the transistors 216 and 218 are coupled together at node 224. The gate terminals of the transistors 216 and 218 are coupled together at node 226 to receive a feedback signal. The source 212, sink 214 and transistors 216 and 220 form a charging circuit.

A first pull-down transistor 228, in this case a MOSFET p-channel device, has its source terminal coupled to node 218 and its drain terminal coupled to the ground supply node. A first pull-up transistor 230, in this case a MOSFET n-channel device, has its source terminal coupled to node 222 and its drain terminal coupled to the Vcc supply node. The gate terminals of the transistors 228 and 230 are coupled together at node 232.

A capacitor C2 is coupled between node 224 and the ground supply node.

A first CMOS inverter circuit 240 is formed by series connecting the source-drain paths of a first diode-connected transistor 80, in this case a MOSFET p-channel device with its gate terminal connected to its drain terminal, a p-channel MOSFET transistor 82, an n-channel MOSFET transistor 84 and a second diode-connected transistor 86, in this case a MOSFET n-channel device with its gate terminal connected to its drain terminal. The drain terminals of the MOSFET transistors 82 and 84 are coupled together at node 242. The gate terminals of the MOSFET transistors 82 and 84 are coupled together at node 224.

A second CMOS inverter circuit 244 has its input coupled to node 242 and its output coupled to node 246. A third CMOS inverter circuit 248 has its input coupled to node 246 and its output coupled to node 250. A fourth CMOS inverter circuit 252 has its input coupled to node 250 and its output coupled to node 254. A fifth CMOS inverter circuit 256 has its input coupled to node 254 and its output coupled to output node OUT.

A second pull-up transistor 170, in this case a MOSFET p-channel device, has its source terminal coupled to the VCC supply node and its drain terminal coupled to node 172 (at the location where the drain terminal of first diode-connected transistor 80 is coupled to the source terminal of p-channel MOSFET transistor 82). A second pull-down transistor 174, in this case a MOSFET n-channel device, has its source terminal coupled to the ground supply node and its drain terminal coupled to node 176 (at the location where the drain terminal of second diode-connected transistor 86 is coupled to the source terminal of n-channel MOSFET transistor 86).

The inverter circuit 240 accordingly operates with a selectively configurable threshold switching voltage. The threshold switching voltage has a first voltage level (for example, 2Vcc/3) when transistor 170 is actuated to shunt across transistor 80, and has a second voltage level (for example, Vcc/3) when transistor 174 is actuated to shunt across transistor 86.

A sixth CMOS inverter circuit 258 has its input coupled to node 250 and its output coupled to the gate terminals of second pull-up transistor 170 and second pull-down transistor 174 at node 260.

Node 254 is short circuit connected to node 226 in the feedback loop to supply the feedback signal for ring oscillation. Node 250 is short circuit connected to node 232 to control operation of the pull-up and pull-down transistors 228 and 230 in order to ensure a smooth change between the charge/discharge as will be described herein. Each CMOS inverter circuit (244, 248, 252, 256 and 258) comprises a p-channel MOSFET and n-channel MOSFET whose source-drain paths are coupled in series between the Vcc supply node and the ground supply node. The gate terminals of the transistors in the CMOS inverter circuit are coupled together at the inverter input and the drain terminals of the transistors are coupled together at the inverter output. The circuit 210 of FIG. 7 is capable of operating with an output frequency as high as, for example, tens of megahertz. The principle of circuit 210 operation is to charge and discharge the capacitively coupled node 224 with the source current from source 212 and the sink current from sink 214, respectively. The voltage at node 260 changes quickly between the Vcc voltage and the ground voltage. This voltage at node 260 is further used to decrease current consumption by the first CMOS inverter circuit 240 (for example, in comparison to inverter 40 of the circuit 10 of FIG. 1), and thus reduce the overall current consumption of the circuit 210.

Assume at start-up that nodes 224 and 260 are at the ground voltage. The ground voltage at node 260 causes transistor 170 to be turned on (shunting across the diode-connected transistor 80) and causes transistor 174 to be turned off (thus leaving diode-connected transistor 86 in the inverter circuit). Node 254 will also be at the ground voltage, and this will cause transistor 216 to turn on and pass source current from source 212 so as to charge capacitor C2, with the voltage on capacitor C2 rising towards the higher threshold switching voltage of the inverter circuit 140. This higher threshold switching voltage may, for example, be about 2Vcc/3 due to the operation of transistors 170 and 174 and the selective presence of only diode-connected transistor 86 (because transistor 80 is shunted by actuation of transistor 170). When the voltage stored on capacitor C2 exceeds the higher threshold switching voltage of the inverter circuit 240, the inverter 240 switches state and node 242 is forced to the ground voltage. The states of inventors 244, 248, 252 and 258 then cause nodes 254 and 260 to quickly switch to the Vcc voltage (with node 250 switching to the ground voltage to turn transistor 228 on and transistor 230 off in order to ensure a smooth change between the charge/discharge). The Vcc voltage at node 160 causes transistor 174 to be turned on (shunting across the diode-connected transistor 86) and causes transistor 170 to be turned off (thus leaving diode-connected transistor 80 in the inverter circuit). The Vcc voltage at node 254 (and thus also at node 126) turns off transistor 216 and turns on transistor 220. Sink current from sink 214 discharges capacitor C2 causing the voltage at node 224 to fall towards the lower threshold switching voltage of the inverter circuit 240. This lower threshold switching voltage may, for example, be about Vcc/3 due to the operation of transistors 170 and 174 and the selective presence of only diode-connected transistor 80 (because transistor 86 is shunted by actuation of transistor 174). When the voltage stored on capacitor C2 falls below the lower threshold switching voltage of the inverter circuit 240, the inverter 240 switches state and node 242 is forced to the Vcc voltage. The states of inventors 244, 248, 252 and 258 then cause nodes 254 and 260 to quickly switch to the ground voltage (with node 250 switching to the Vcc voltage to turn transistor 228 off and transistor 230 on in order to ensure a smooth change between the charge/discharge). The ground voltage at node 254 (and thus also at node 226) turns on transistor 216 and turns of transistor 220, and the cycle of operation as described above repeats. The output signal at output node OUT is an oscillating square wave whose frequency is set as a function of the capacitances of capacitor C2 and the current strength of source 212 and sink 214.

Figure 8:
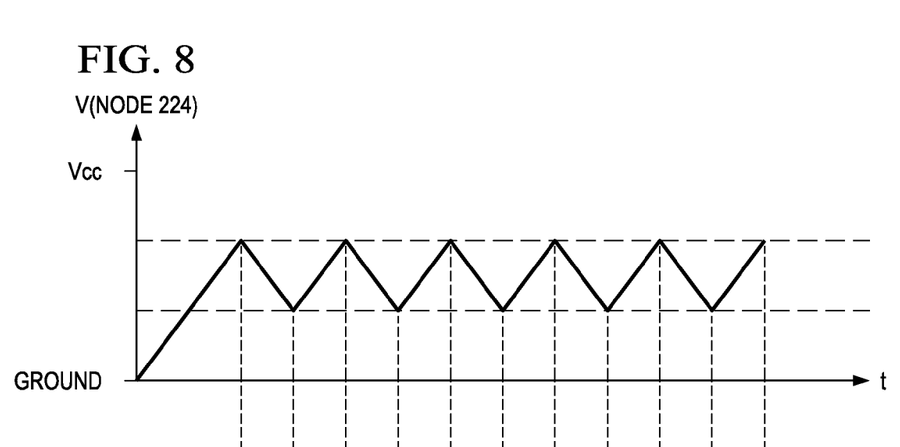
FIG. 8 is a waveform diagram showing change in capacitor voltage over time for the circuit of FIG. 7.
Figure 9:
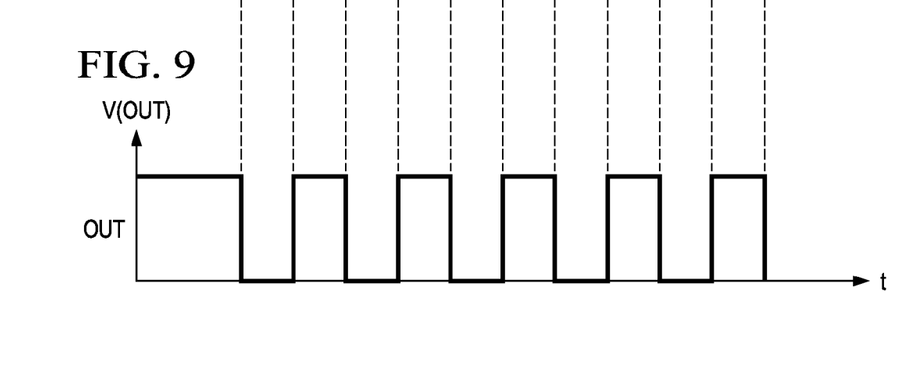
FIG. 9 is a waveform diagram showing the output signal for the circuit of FIG. 7.

An advantage of the circuit 210 architecture is that the change in voltage at node 224 transitions only between Vcc/3 and 2Vcc/3 as shown in FIG. 8 so as to reduce current consumption. The output signal OUT is shown in FIG. 9.

With respect to the operation of inverters 140 and 240, those skilled in the art will recognize that transistors 82 and 84 for an inverter within the overall inverter 140/240. There will always be a diode connected MOS (either transistor 80 or transistor 86) connected in series to the inverter formed by transistors 82 and 84 between Vcc and Ground. The transistors 80, 82 and 84 are connected in series when transistor 174 is turned on. The transistors 82, 84 and 86 are connected in series when transistor 170 is turned on. The diode connection transistor (80 or 86) that is active within inverter 240 forces the voltage across the inverter formed by transistors 82 and 84 to be about 2Vcc/3. It is because of this configuration that the current consumption of inverter 140/240 is lower than inverter 40.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a capacitor coupled between a charge node and a first reference node;
   a charging circuit operating to alternately charge and discharge the capacitor;
   a first inverter circuit having an input coupled to the capacitor and having an output, the first inverter circuit comprising a first transistor, second transistor, third transistor and fourth transistor having source-drain paths coupled in series between a first supply node and a second supply node, wherein the first and fourth transistors are diode-connected devices;
   a feedback loop coupling the output of the first inverter circuit to an input of the charging circuit;
   a first pull-up transistor operating responsive to a first logic state of a feedback signal in the feedback loop to selectively shunt across the first transistor of the first inverter circuit; and
   a first pull-down transistor operating responsive to a second logic state of the feedback signal to selectively shunt across the fourth transistor of the first inverter circuit.

2. The circuit of claim 1, wherein the first reference node is a same node as one of the first and second supply nodes.

3. The circuit of claim 1, wherein the feedback loop comprises:
   a second inverter circuit having an input coupled to the output of the first inverter circuit;
   a third inverter circuit having an input coupled to an output of the second inverter circuit; and
   a fourth inverter circuit having an input coupled to an output of the third inverter circuit;
   wherein an output of the fourth inverter circuit is coupled to control terminals of the first pull-up circuit and first-pull down circuit.

4. The circuit of claim 1, wherein the charging circuit comprises:
   a fifth and sixth transistors having source-drain paths coupled in series;
   a current source coupled to source current to the source-drain path of the fifth transistor;
   a current sink coupled to sink current from the source-drain path of the sixth transistor;
   wherein control terminals of the fifth and sixth transistors are coupled together at the input of the charging circuit.

5. A circuit, comprising:
   a capacitor coupled between a charge node and a first reference node;
   another capacitor coupled between the charge node and a second reference node;
   a charging circuit operating to alternately charge and discharge the capacitor;
   a first inverter circuit having an input coupled to the capacitor and having an output, the first inverter circuit comprising a first transistor, second transistor, third transistor and fourth transistor having source-drain paths coupled in series between a first supply node and a second supply node;
   a feedback loop coupling the output of the first inverter circuit to an input of the charging circuit:
   a first pull-up transistor operating responsive to a first logic state of a feedback signal in the feedback loop to selectively shunt across the first transistor of the first inverter circuit; and
   a first pull-down transistor operating responsive to a second logic state of the feedback signal to selectively shunt across the fourth transistor of the first inverter circuit.

6. The circuit of claim 5, wherein the first and fourth transistors are diode-connected devices.

7. The circuit of claim 5, further comprising a further capacitor coupled between the charge node and a node of the feedback loop.

8. The circuit of claim 5, wherein the first reference node is the first supply node and the second reference node is the second supply node.

9. A circuit, comprising:
   a capacitor coupled between a charge node and a first reference node;
   a charging circuit operating to alternately charge and discharge the capacitor;
   a first inverter circuit having an input coupled to the capacitor and having an output, the first inverter circuit comprising a first transistor, second transistor, third transistor and fourth transistor having source-drain paths coupled in series between a first supply node and a second supply node;
   a feedback loop coupling the output of the first inverter circuit to an input of the charging circuit:
   a first pull-up transistor operating responsive to a first logic state of a feedback signal in the feedback loop to selectively shunt across the first transistor of the first inverter circuit; and
   a first pull-down transistor operating responsive to a second logic state of the feedback signal to selectively shunt across the fourth transistor of the first inverter circuit;
   wherein the feedback loop comprises:
      a second inverter circuit having an input coupled to the output of the first inverter circuit;
      a third inverter circuit having an input coupled to an output of the second inverter circuit; and
      a fourth inverter circuit having an input coupled to an output of the third inverter circuit;
      wherein an output of the fourth inverter circuit is coupled to the input of the charging circuit.

10. A circuit, comprising:
    a capacitor coupled between a charge node and a first reference node;
    a charging circuit operating to alternately charge and discharge the capacitor;
    a first inverter circuit having an input coupled to the capacitor and having an output, the first inverter circuit comprising a first transistor, second transistor, third transistor and fourth transistor having source-drain paths coupled in series between a first supply node and a second supply node;
    a feedback loop coupling the output of the first inverter circuit to an input of the charging circuit:

a first pull-up transistor operating responsive to a first logic state of a feedback signal in the feedback loop to selectively shunt across the first transistor of the first inverter circuit; and a first pull-down transistor operating responsive to a second logic state of the feedback signal to selectively shunt across the fourth transistor of the first inverter circuit, wherein the charging circuit comprises:
- a fifth and sixth transistors having source-drain paths coupled in series;
- a current source coupled to source current to the source-drain path of the fifth transistor;
- a current sink coupled to sink current from the source-drain path of the sixth transistor,
  wherein control terminals of the fifth and sixth transistors are coupled together at the input of the charging circuit;
- a second pull-up transistor operating responsive to the first logic state of the feedback signal to selectively connect the current sink to a first supply node; and
- a first pull-down transistor operating responsive to a second logic state of the feedback signal to selectively connect the current source to a second supply node.

11. A circuit, comprising:
a first transistor having a source-drain path coupled between a first supply node and a charge node;
a second transistor having a source-drain path coupled between the charge node and a second supply node;
wherein control terminals of the first and second transistors are connected together at an input node;
a capacitor coupled between the charge node and a first reference node;
a third transistor, fourth transistor, fifth transistor and sixth transistor having source-drain paths coupled in series between the first supply node and the second supply node, wherein the third and sixth transistors are diode-connected devices;
wherein control terminals of the fourth and fifth transistors are connected together at the charge node and drain terminals of the fourth and fifth transistors are connected together at an output node;
a feedback loop coupling the output node to the input node;
a seventh transistor having a source-drain path coupled in parallel with the source-drain path of the third transistor and having a control terminal coupled to the feedback loop; and
an eighth transistor having a source-drain path coupled in parallel with the source-drain path of the sixth transistor and having a control terminal coupled to the feedback loop.

12. The circuit of claim 11, wherein the first reference node is a same node as one of the first and second supply nodes.

13. The circuit of claim 11, further comprising another capacitor coupled between the charge node and a second reference node.

14. The circuit of claim 11, further comprising a further capacitor coupled between the charge node and a node of the feedback loop.

15. The circuit of claim 11, wherein the feedback loop comprises:
a first inverter circuit having an input coupled to the output node;
a second inverter circuit having an input coupled to an output of the first inverter circuit; and a third inverter circuit having an input coupled to an output of the second inverter circuit;
wherein an output of the third inverter circuit is coupled to the control terminals of the seventh and eighth transistors.

16. The circuit of claim 15, further comprising a further capacitor coupled between the charge node and the output of the third inverter circuit.

17. The circuit of claim 11, wherein the feedback loop comprises:
a first inverter circuit having an input coupled to the output node;
a second inverter circuit having an input coupled to an output of the first inverter circuit; and
a third inverter circuit having an input coupled to an output of the second inverter circuit;
wherein an output of the third inverter circuit is coupled to the control terminals of the first and second transistors.

18. The circuit of claim 11, further comprising:
a current source configured to source current to a source node of the first transistor; and
a current sink configured to sink current from a source node of the second transistor.

19. The circuit of claim 18, further comprising:
a ninth transistor having a source-drain path coupled between the first node and the second supply node and having a control terminal coupled to the feedback loop; and
a tenth transistor having a source-drain path coupled between the second node and the first supply node and having a control terminal coupled to the feedback loop.

20. A circuit, comprising:
a capacitor coupled between a charge node and a first reference node;
a charging circuit operating to alternately charge and discharge the capacitor;
a first inverter circuit having an input coupled to the capacitor and having an output, the first inverter circuit being selectively configurable to operate with two different threshold switching voltages;
wherein the first inverter circuit comprises:
- a first shunting transistor configured to shunt a first node of the first inverter circuit to a first supply node in response to the first logic state of the feedback signal so as to select the first threshold switching voltage; and
- a second shunting transistor configured to shunt a second node of the first inverter circuit to a second supply node in response to the second logic state of the feedback signal so as to select the second threshold switching voltage; and
a feedback loop coupling the output of the first inverter circuit to an input of the charging circuit;
wherein the feedback loop comprises:
a second inverter circuit having an input coupled to an output of the first inverter circuit:
a third inverter circuit having an input coupled to an output of the second inverter circuit; and
a fourth inverter circuit having an input coupled to an output of the third inverter circuit;
wherein an output of the fourth inverter circuit is coupled to control terminals of the first and second shunting transistors;
wherein a first threshold switching voltage is selected for the first inverter circuit in response to a first logic state of a feedback signal in the feedback loop; and wherein a second threshold switching voltage, different from the first threshold switching voltage, is selected for the first inverter circuit in response to a second logic state of the feedback signal in the feedback loop.

* * * * *